United States Patent [19]
Blossfeld

[11] 4,346,313
[45] Aug. 24, 1982

[54] MONOLITHIC INTEGRATED THRESHOLD SWITCH

[75] Inventor: Lothar Blossfeld, Freiburg-Hochdorf, Fed. Rep. of Germany

[73] Assignee: ITT Industries, Inc., New York, N.Y.

[21] Appl. No.: 688,519

[22] Filed: May 20, 1976

[51] Int. Cl.³ ............... H03K 5/153; G01R 19/165; G01R 19/175
[52] U.S. Cl. ................................. 307/350; 307/289; 307/299 B; 357/92
[58] Field of Search ............ 307/235 R, 235 E, 235 J, 307/235 N, 235 T, 235 W, 289, 290, 296, 303, 254, 299 B; 357/92, 44, 46

[56] References Cited
U.S. PATENT DOCUMENTS
3,942,044 3/1976 Armstrong ................... 307/235 K Primary Examiner—John Zazworsky
Attorney, Agent, or Firm—John T. O'Halloran; Peter C. Van Der Sluys

[57] ABSTRACT

This invention relates to a monolithically integrated threshold switch which switches on at an upper voltage value of a hysteretic characteristic and switches off at a lower voltage value especially adapted to I²L ICs. Over a resistance the value of which determines the upper voltage value the input is fed to the base of a first transistor which has no injector nor current feeding, and to a first collector of a multicollector transistor the base of which is fed to its second collector and to a current source. Any output signal may be derived from any additional collector of one of the two transistors.

7 Claims, 2 Drawing Figures

MONOLITHIC INTEGRATED THRESHOLD SWITCH

BACKGROUND OF THE INVENTION

This invention relates to a monolithic integrated threshold switch and, more particularly, to a monolithic integrated circuit of I²L design.

This design principle, the "integrated injection logic" (I²L)—cf. "Philips Techn. Rev.", 33, No. 3 (1973), pp. 76 to 85—is also referred to as "merged transistor logic"—cf. "1972 IEEE International Solid-State Circuits Conference", Digest of Technical Papers, pp. 90 to 93. The main features of this design principle are collector regions lying at the semiconductor surface, and injectors which are common to a plurality of transistors and, as part of a lateral transistor structure, control the current flow in the vertical transistors and serve as current sources. The injector can be represented in the equivalent circuit diagram as an equivalent transistor whose base is at the emitter potential of the respective vertical transistor, and whose collector is connected to the base of this vertical transistor. The collector region of the equivalent transistor is identical with the base region of the vertical transistor. For clarity, these equivalent transistors corresponding to the injectors have been omitted in the accompanying drawing.

The advantages of the integrated injection logic lie in the fact that relatively little semiconductor surface is required, and that it is easy to realize digital circuits with multicollector transistors by the normal planar diffusion technique without resistors and capacitors. Furthermore, no special current sources are required for the transistors, which are supplied with current via the injectors. Since, moreover, the individual transistors can be provided with electrically isolating regions to reduce the semiconductor surface required, it is desirable to have circuits which can readily be combined with a monolithic integrated circuit of I²L design, particularly circuits whose emitters are at a common potential.

SUMMARY OF THE INVENTION

The invention relates to a monolithic integrated threshold switch which switches on at an upper voltage value $U_o$ of a hysteretic input-voltage/output-voltage characteristic, and switches off at a lower voltage value $U_u$.

It is the object of the invention to provide a circuit of a monolithic integrated threshold switch which makes it possible to eliminate unwanted spikes in input stages of integrated circuits, particularly of monolithic integrated circuits of I²L design, and requires as little semiconductor surface as possible.

The above and other objects of the present invention will be more clearly understood from the following detailed description taken in conjunction with the accompanying drawings in which:

DESCRIPTION OF THE PREFERRED EMBODIMENT

Figure 1:
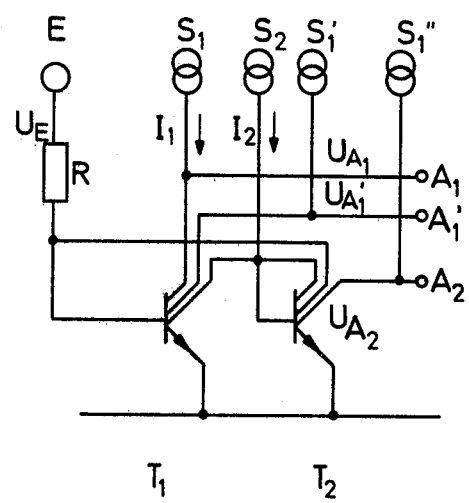
FIG. 1 shows the circuit of the monolithic integrated threshold switch in accordance with the invention.

FIG. 1 shows the monolithic integrated threshold switch according to the invention with two multicollector transistors $T_1$ and $T_2$. The input of the threshold switch is connected through a resistor R to the base of the first transistor $T_1$ and to a first collector of a second transistor $T_2$ designed as a multicollector transistor, as shown in FIG. 1.

While the current $I_1$ for the first collector of the first transistor $T_1$ comes from a first current source $S_1$, the base of the second transistor $T_2$, which base is connected to the second collector of the second transistor $T_2$ and to a second collector of the first transistor $T_1$, receives its current $I_2$ from a current source $S_2$. By contrast, the base of the first transistor $T_1$ of the monolithic integrated threshold switch in accordance with the invention receives no current from an injector or a current source. The first transistor $T_1$ may be realized using I²L technology; its base region, however, must not receive current from an injector. If required, further collectors may be provided each of which receives the current $I_1$ from a current source $S_1'$, $S_1''$, and from each of which an output signal $U_{A1'}$, $U_{A2}$ can be tapped.

The monolithic integrated threshold switch provides an output signal $U_{A1}$, which can be taken from the first collector of the first transistor $T_1$, from any other collector of this transistor, or from any collector of the transistor $T_2$.

The transistor $T_2$ has an adjusted $B=(I_C/I_B)$ of about 1, which is achieved by means of a conductive connection between its collector and its base. When a current $I_2$ is fed into the base of this transistor $T_2$, the other collectors of this transistor $T_2$ can assume $I_2$ only if I²L technology is employed.

Figure 2:
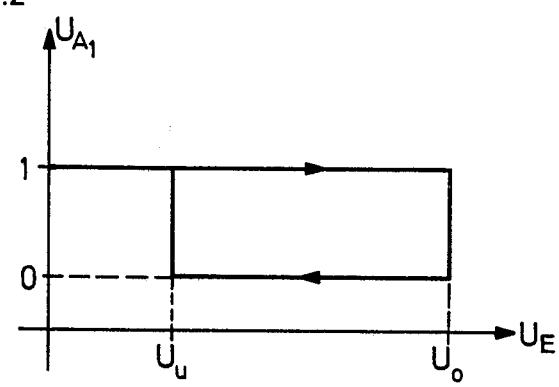
FIG. 2 shows the hysteretic input-voltage/output-voltage characteristic of the threshold switch according to the invention.

When the input voltage $U_E$ at the input E rises from OV, $U_{A1}$ changes to the 1 state as shown in FIG. 2. It remains in this state until the current $I_2$ is exceeded as a result of the resistor R.

Then a base current begins to flow in the transistor $T_1$; this base current cuts the transistor $T_2$ off. Due to the feedback between the transistor $T_1$ and the transistor $T_2$, this switching is very fast, so the output voltage $U_{A1}$ returns to the O state. The total current flowing through the resistor R now flows as the base current through the transistor $T_1$. When the voltage across the output resistor (not shown) falls below the threshold value $U_{BE}$, i.e. below 0.7 V, (if a semiconductor body of silicon is used), $U_{A1}$ will switch back to the 1 state.

Since the output current is not switched from 0 to 1 until the collector current $I_1$ of the transistor $T_1$ has become smaller than the current $I_2$ of the transistor $T_2$, the current $I_1$ at the output $A_1$, $A_1'$ or $A_2$ must be chosen to be smaller than or equal to $I_2$ and smaller than $I_2$ if clean square-wave pulses are to be obtained.

A more detailed description of the operation of the threshold switch of the present invention follows.

Since transistor $T_2$ represents a current mirror having a current transformation of 1:1, each collector of transistor $T_2$ comes from the saturation state if the load current is $I_E \geq I_2$. As long as the current $I_E = [(U_E - U_{sat})/R] \leq I_2$ the collector of transistor $T_2$ remains in the saturation state, i.e. in the logical state of 0. If the base of transistor $T_1$ has the logical state of 0 ($U_E = 0$), $U_{A1}$ has the logical state of 1. This state of $U_{A1}$ can only change if the base of transistor $T_1$ takes the state of 1. This state, however, can only be taken by the base of transistor $T_1$ if $U_E$ has increased to the extent that $[(U_E-U_{sat})/R]=I_E\geq I_2$. In that event current $I_2$ is fed to the collector of transistor $T_2$ and the current $I_E-I_2$ is fed to the base of transistor $T_1$. Transistor $T_2$ becomes non-conductive. Thus, current $I_2$ of the current mirror transistor $T_2$ decreases and there results a feedback accelerating the turnover into the logical state of $U_{A1}=0$. This feedback takes place after the voltage $U_{sat}$ at the base of transistor $T_1$ has increased to the extent of $U_{sat}\approx U_{BE}$ of a transistor. Thus, the upper switching threshold voltage $U_o$ is defined (see FIG. 2).

As long as $U_E\leq R\cdot I_2+U_{sat}$, the voltage at the base of transistor $T_1$ remains $U_{sat}$, since transistor $T_2$ is a transistor with a current amplification of 1 and since the collectors of transistor $T_2$ only leave the saturation state if their load current exceeds $I_2$. The condition to achieve this is (according to FIG. 1) $U_E\geq R\cdot I_2+U_{sat}$. Accordingly, as long as $U_E<R\cdot I_2+U_{sat}$, the logical state of 0 at the base of transistor $T_1$ is maintained. (Transistor $T_1$ and transistor $T_2$ are a bistable system, $I_2/I_{BT_1}>1$.)

The current $I_2$ is exceeded if the voltage $U_E$ is such that the current $I_E$ which is fed to the junction point (base of transistor $T_1$—collector transistor $T_2$) via the resistor R exceeds $I_2$.

The feedback between transistor $T_1$ and transistor $T_2$ occurs at the junctions (base of transistor $T_1$—one collector of transistor $T_2$) and (base of transistor $T_2$—another collector of transistor $T_2$—one collector of transistor $T_1$) (FIG. 1).

If the voltage $U_E$ falls below $U_{BE}$, then current leaks off from base of transistor $T_1$ until transistor $T_1$ becomes non-conducting and its base current approaches 0. As soon as the base current of transistor $T_1$ is $^{IBT}1\leq(I_2/B)$ (if $B=I_1/I_{BT_1}$ is current amplification of transistor $T_1$), then transistor $T_2$ becomes conducting. The collector current of transistor $T_2$ discharges the base of transistor $T_1$ which attains the state of 0. This, too, is a feedback.

The input current turns transistor $T_1$ on, it does not turn $T_2$ off. Transistor $T_2$ is turned off by a collector of transistor $T_1$ (FIG. 1).

The hysteretic input-voltage/output-voltage characteristic of FIG. 2 is adjustable with respect to the upper voltage threshold value $U_o$ because $$U_o \approx U_{BE}+R\cdot I_2 \text{ volts}$$

with $U_{BE}=U_u=0.7$ V for silicon.

At a predetermined upper voltage value $U_o$, the value of the resistor therefore has to be chosen according to the equation $$R=(U_o-U_{BE})/I_2$$

The harmless range of the amplitude ratio with respect to disturbing spikes in the input signal, within which undesired switching cannot take place, can thus be selected by suitable choice of the value of the resistor R and of the current I.

While the principles of this invention have been described above in connection with specific apparatus, it is to be understood that this description is made only by way of example and not as a limitation on the scope of the invention as set forth in the objects and features thereof and in the accompanying claims.

What is claimed is:

1. A monolithic integrated threshold switch which switches on at an upper voltage valve of a hysteretic input voltage/output voltage characteristic and switches off at a lower voltage comprising:
    a first transistor having at least first and second collectors;
    a second transistor having a first collector coupled to the base of said first transistor and said second transistor having a second collector coupled to the base of said second transistor and to said second collector of said first transistor, the emitters of said first and second transistors being coupled together;
    means for applying an input current to the base of said first transistor and said first collector of said second transistor for turning on said first transistor which in turn cuts off said second transistor;
    first means for applying a first current to said first collector of said first transistor; and
    second means for applying a second current to the base of said second transistor and said second collector of said second transistor, said second transistor turning off when said input current exceeds said second current.

2. A monolithic integrated threshold switch according to claim 1 further comprising a resistor coupled between the base of said first transistor and an input voltage for developing said input current.

3. A monolithic integrated threshold switch according to claim 1 wherein said second current is coupled to said second collector of said first transistor.

4. A monolithic integrated threshold switch according to claim 3 wherein the output of said threshold switch is tapped from any collector of said first and second transistors.

5. A monolithic integrated threshold switch according to claim 4 wherein said resistor has a value of $$R=(U_o-U_{BE})/I_2$$

where $U_{BE}$ is the threshold value in the current voltage characteristic of the base and the emitter $U_o$ is said upper voltage and $I_2$ is said second current.

6. An integrated injection logic circuit having an input terminal and an output terminal, comprising: first means for inverting an input signal, the first means for inverting having an input and an output; second means for inverting a signal, the second means having an input and first, second, and third outputs wherein the first output of the second means is connected to the input of the second means and the second output is connected to the input of the first means, the input of the second means being coupled to the output of the first means whereby the logic circuit can provide a latch function with only one input terminal, the third output of the second means being coupled to the output terminal of the integrated injection logic circuit; and a third means for providing current to the first and second means.

7. An integrated injection logic circuit, comprising: a first transistor having a base, an emitter, and a collector, the base of the first transistor serving as an input to the circuit; a second transistor having a base, an emitter, and a first, a second, and a third collector, the base of the second transistor being coupled to the collector of the first transistor, the emitter of the second transistor being coupled to the emitter of the first transistor, the first collector being connected to the base of the second transistor, the second collector being coupled to the input of the circuit, and the third collector serving as an output for the circuit; and a current source coupled to the collector of the first transistor.

* * * * *